(12) United States Patent
Baek (10) Patent No.: US 11,406,027 B2
(45) Date of Patent: Aug. 2, 2022

(54) RELEASE FILM FOR WINDOW AND METHOD OF MANUFACTURING THE SAME

(71) Applicant: Samsung Display Co., Ltd., Yongin-si (KR)

(72) Inventor: Won-jong Baek, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 351 days.

(21) Appl. No.: 16/659,465

(22) Filed: Oct. 21, 2019

(65) Prior Publication Data

US 2020/0196457 A1  Jun. 18, 2020

(30) Foreign Application Priority Data

Dec. 13, 2018  (KR) .................. 10-2018-0160909

(51) Int. Cl.
| | |
|---|---|
| *B32B 7/06* | (2019.01) |
| *H05K 5/00* | (2006.01) |
| *H05K 5/03* | (2006.01) |
| *B32B 7/12* | (2006.01) |
| *B29C 64/188* | (2017.01) |
| *B32B 17/06* | (2006.01) |
| *B32B 37/12* | (2006.01) |
| *B32B 38/00* | (2006.01) |
| *B32B 37/18* | (2006.01) |

(Continued)

(52) U.S. Cl.
CPC ......... *H05K 5/0017* (2013.01); *B29C 64/188* (2017.08); *B32B 7/06* (2013.01); *B32B 7/12* (2013.01); *B32B 17/06* (2013.01); *B32B 17/065* (2013.01); *B32B 27/304* (2013.01); *B32B 37/12* (2013.01); *B32B 37/1207* (2013.01); *B32B 37/182* (2013.01); *B32B 38/145* (2013.01); *H05K 5/03* (2013.01); *B29L 2031/3481* (2013.01); *B32B 2037/1253* (2013.01); *B32B 2255/26* (2013.01); *B32B 2307/4023* (2013.01); *B32B 2310/0831* (2013.01); *B32B 2315/08* (2013.01)

(58) Field of Classification Search
CPC ..... B32B 7/06; B32B 27/304; B32B 2457/20; B32B 2457/206; B32B 2457/208
See application file for complete search history.

(56) References Cited

U.S. PATENT DOCUMENTS

| | | | |
|---|---|---|---|
| 2005/0079328 A1 | 4/2005 | Mizutani et al. | |
| 2015/0000836 A1* | 1/2015 | Ogawa | G02F 1/1333 156/273.5 |

(Continued)

FOREIGN PATENT DOCUMENTS

| | | | |
|---|---|---|---|
| CN | 105670382 | * | 6/2016 |
| KR | 10-0597189 B1 | | 7/2006 |

(Continued)

*Primary Examiner* — Elizabeth E Mulvaney
(74) *Attorney, Agent, or Firm* — Lewis Roca Rothgerber Christie LLP (57) ABSTRACT

In a method of manufacturing a release film for a window, the method includes: providing the window comprising a light transmitting area and a light shielding area; forming a window print layer on the window to entirely overlap the light transmitting area and the light shielding area; and curing the window print layer, wherein the window print layer comprises a polyvinyl chloride.

20 Claims, 11 Drawing Sheets

(51) Int. Cl.
  *B32B 27/30*  (2006.01)
  *B29L 31/34*  (2006.01)

(56) References Cited

U.S. PATENT DOCUMENTS

| | | | |
|---|---|---|---|
| 2015/0169089 A1* | 6/2015 | Dixon | B32B 38/0004 428/137 |
| 2015/0208536 A1* | 7/2015 | You | B32B 27/08 428/38 |
| 2016/0096966 A1 | 4/2016 | Chang | |
| 2018/0146564 A1 | 5/2018 | Wang et al. | |
| 2018/0196559 A1* | 7/2018 | Lin | G06F 1/1626 |

FOREIGN PATENT DOCUMENTS

| | | |
|---|---|---|
| KR | 10-2015-0042092 A | 4/2015 |
| KR | 10-2016-0041153 A | 4/2016 |
| KR | 10-2018-0057821 A | 5/2018 |

* cited by examiner

RELEASE FILM FOR WINDOW AND METHOD OF MANUFACTURING THE SAME

CROSS-REFERENCE TO RELATED APPLICATION

The present application claims priority to and the benefit of Korean Patent Application No. 10-2018-0160909, filed on Dec. 13, 2018, the content of which is hereby incorporated by reference in its entirety.

BACKGROUND

1. Field

Aspects of some example embodiments of the present disclosure relate to a release film and a method of manufacturing the same.

2. Description of the Related Art

A window that is one of the components of a display device provides a front surface of the display device and protects the display device. In general, the window may include, for example, a window substrate, a sapphire substrate, or a plastic film. The window before assembly may be damaged by external environmental factors, such as air, moisture, dust, and scratches. To prevent or reduce the damage of the window, the window is protected by a release film, and the release film is detached from the window when the display device is assembled.

The above information disclosed in this Background section is only for enhancement of understanding of the background and therefore it may contain information that does not constitute prior art.

SUMMARY

Aspects of some example embodiments of the present disclosure relate to a release film and a method of manufacturing the same. For example, some example embodiments of the present disclosure relate to a release film for a window with an improved yield and a method of manufacturing the release film.

Aspects of some example embodiments of the present disclosure provides a release film for a window with an improved yield.

Aspects of some example embodiments of the present disclosure provides a method of manufacturing the release film for the window.

Aspects of some example embodiments of the inventive concept provide a method of manufacturing a release film for a window, the method including providing the window including a light transmitting area and a light shielding area, forming a window print layer on the window to entirely overlap with the light transmitting area and the light shielding area, and curing the window print layer. The window print layer includes a polyvinyl chloride.

According to some example embodiments, the providing of the window includes providing a base substrate and forming a decoration layer on the light shielding area of the base substrate, and the window print layer covers the decoration layer in the forming of the window print layer.

According to some example embodiments, a weight percent of the polyvinyl chloride relative to a total weight of the window print layer is equal to or more than about 55 wt % and equal to or less than about 65 wt %.

According to some example embodiments, the window print layer further includes a phthalate.

According to some example embodiments, a weight percent of the phthalate relative to a total weight of the window print layer is equal to or more than about 35 wt % and equal to or less than about 65 wt %.

According to some example embodiments, the window further includes at least one hole area spaced apart from the light transmitting area and surrounded by the light shielding area, and the decoration layer is formed not to overlap with the hole area and the light transmitting area in the providing of the window.

According to some example embodiments, before the forming of the window print layer, the method further includes forming a hole print layer to overlap with the hole area and curing the hole print layer to form a hole adhesive film, and the window print layer covers the decoration layer and the hole adhesive film in the forming of the window print layer.

According to some example embodiments, the hole print layer includes the polyvinyl chloride.

According to some example embodiments, a weight percent of the polyvinyl chloride relative to a total weight of the hole print layer is equal to or more than about 55 wt % and equal to or less than about 65 wt %.

According to some example embodiments, the method further includes attaching the hole adhesive film to overlap with the hole area before the forming of the window print layer, and the window print layer covers the decoration layer and the hole adhesive film in the forming of the window print layer.

According to some example embodiments, the window print layer further includes at least one of a pigment, a diluent, and an additive.

According to some example embodiments, the window further includes at least one hole area spaced apart from the light shielding area and surrounded by the light transmitting area, and the window print layer covers the hole area in the forming of the window print layer.

According to some example embodiments, the curing of the window print layer includes applying a heat to the window print layer.

According to some example embodiments, the curing of the window print layer includes irradiating an ultraviolet ray to the window print layer.

According to some example embodiments, the window print layer is formed through a silk screen process.

According to some example embodiments, the window print layer has an adhesive strength equal to or larger than about 50 $gf/in^2$ and equal to or smaller than about 1000 $gf/in^2$.

Some example embodiments of the inventive concept provide a release film for a window including a window adhesive film on the window in which a light transmitting area transmitting an image and a light shielding area surrounding the light transmitting area and shielding the image are defined. The window adhesive film may include a polyvinyl chloride.

According to some example embodiments, a weight percent of the polyvinyl chloride relative to a total weight of the window adhesive film is equal to or more than about 55 wt % and equal to or less than about 65 wt %.

According to some example embodiments, the window adhesive film further includes a phthalate.

According to some example embodiments, a weight percent of the phthalate relative to a total weight of the window adhesive film is equal to or more than about 35 wt % and equal to or less than about 65 wt %.

According to some example embodiments, the release film further includes a hole adhesive film, the window includes at least one hole area defined therein, spaced apart from the light transmitting area, and surrounded by the light shielding area, the hole adhesive film overlaps with the hole area when viewed in a plan view, is between the window adhesive film and the window, and includes the polyvinyl chloride, and the adhesive film is covered by the window adhesive film.

According to some example embodiments, the window includes at least one hole area defined therein, spaced apart from the light shielding area, and surrounded by the light transmitting area, and the window adhesive film entirely covers the hole area, the light transmitting area, and the light shielding area.

According to some example embodiments, the misalignment between the release films on the window may be mitigated. That is, the yield of the window may be improved.

BRIEF DESCRIPTION OF THE DRAWINGS

The above and other characteristics of the present disclosure will become readily apparent by reference to the following detailed description when considered in conjunction with the accompanying drawings wherein.

DETAILED DESCRIPTION

It will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, aspects of some example embodiments of the present disclosure will be explained in more detail with reference to the accompanying drawings.

Figure 1:
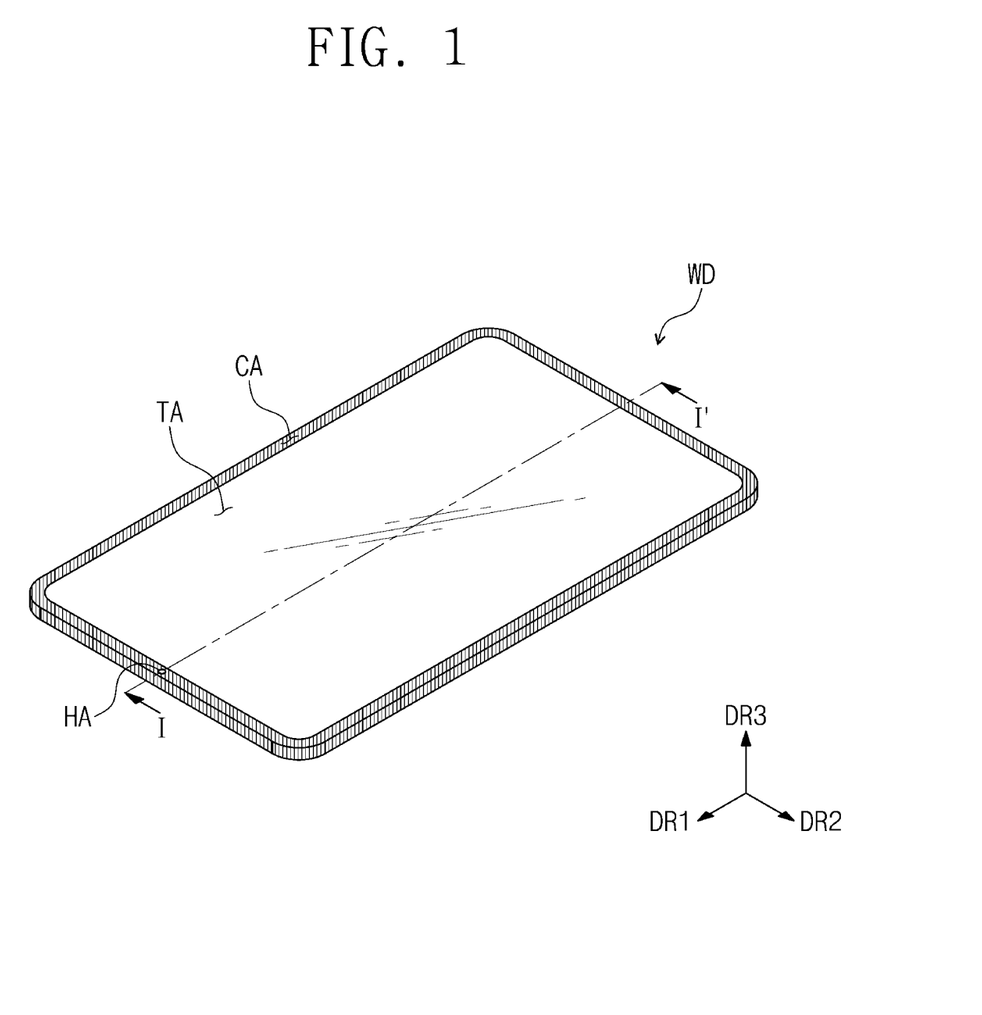
FIG. 1 is a perspective view showing a window according to some example embodiments of the present disclosure.

FIG. 1 is a perspective view showing a window WD according to some example embodiments of the present disclosure.

Referring to FIG. 1, the window WD has a quadrangular shape with two long sides in a first direction DR1 and two short sides in a second direction DR2 crossing the first direction DR1. However, the quadrangular shape is merely an example, and the shape of the window WD is not particularly limited.

The window WD according to some example embodiments of the present disclosure may be one of components of a display device. For example, the window WD provides a front surface of the display device. The window WD has a light transmitting property in at least an area thereof. Accordingly, an image provided from the display device may be perceived by a user after transmitting through the window WD.

For example, the window WD includes a light transmitting area TA, a light shielding area CA, and a hole area HA, which are defined in a plan view. The light transmitting area TA corresponds to an area through which a light transmits. The light shielding area CA is located adjacent to the light transmitting area TA. The light shielding area CA surrounds the light transmitting area TA. As an example, the light shielding area CA has a frame shape, however, the shape of the light shielding area CA should not be particularly limited. According to some example embodiments of the present disclosure, the light shielding area CA may be defined in the window WD to be adjacent to only one side portion of the light transmitting area TA.

The light shielding area CA may have a predetermined color. As an example, the light shielding area CA may have a black color, however, the color or material of the light shielding area CA should not be particularly limited.

The hole area HA is spaced apart from the light transmitting area TA when viewed in a plan view. For example, the hole area HA is arranged to be adjacent to one side of the light transmitting area TA in the first direction DR1, but spaced apart from the one side of the light transmitting area TA. The hole area HA may be surrounded by the light shielding area CA.

The hole area HA may overlap with a photosensor or a camera included in the display device when viewed in a plan view. The photosensor or camera may receive signals from an outside.

The hole area HA is shown to have a circular shape in FIG. 1, however, the shape of the hole area HA of the present disclosure should not limited thereto or thereby. In addition, one hole area HA is defined in the window WD in FIG. 1, but the number of the hole areas should not be limited to one in the present disclosure. According to some example embodiments of the present disclosure, the hole area HA may be provided in plural number.

Figure 2:
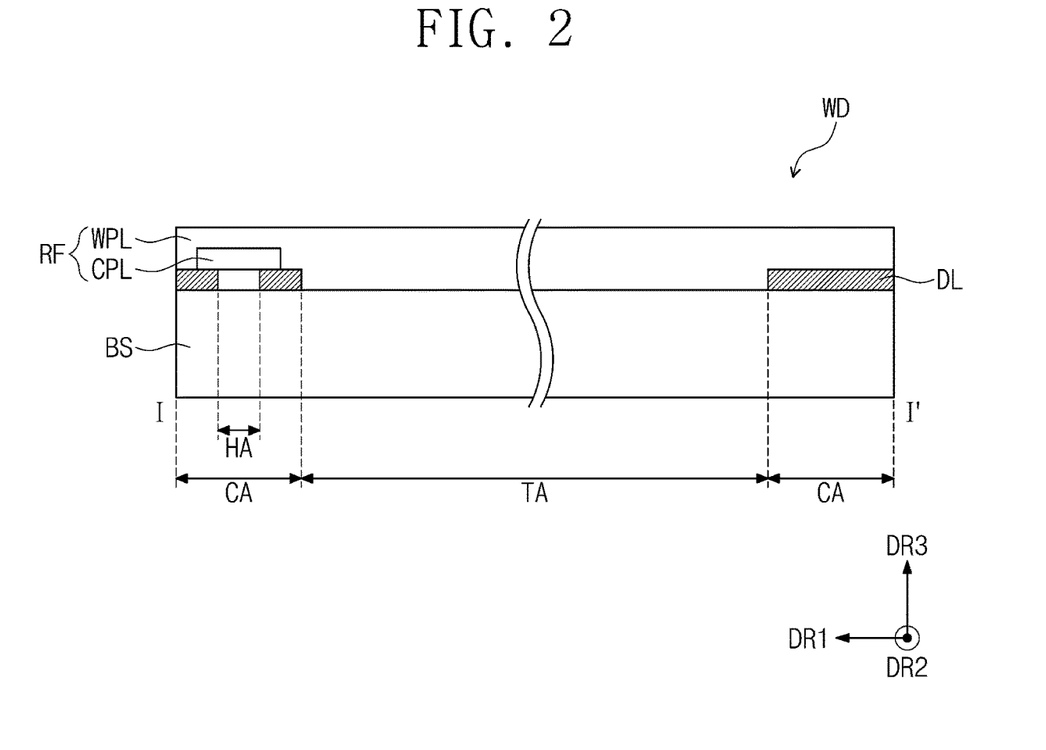
FIG. 2 is a cross-sectional view taken along a line I-I' shown in FIG. 1.

FIG. 2 is a cross-sectional view taken along a line I-I' shown in FIG. 1.

Referring to FIG. 2, the window WD according to some example embodiments of the present disclosure includes a base substrate BS and a decoration layer DL.

The base substrate BS has a light transmitting property. For example, the base substrate BS may include at least one of a glass substrate, a sapphire substrate, and a plastic film. In addition, the base substrate BS may have a single-layer or multi-layer structure. As an example, the base substrate BS may have a stack structure in which plural plastic films are coupled to each other by an adhesive or a stack structure in which the glass substrate is coupled to the plastic film by the adhesive.

The decoration layer DL is arranged on the light shielding area CA of the base substrate BS. The decoration layer DL defines the above-described light shielding area CA. The decoration layer DL does not overlap with the light transmitting area TA and the hole area HA when viewed in a plan view. That is, an upper surface of the base substrate BS, which overlaps with the light transmitting area TA and the hole area HA, is exposed by the decoration layer DL.

The decoration layer DL has a predetermined color. The decoration layer DL absorbs or reflects the light incident thereto.

According to some example embodiments of the present disclosure, the decoration layer DL having a single-layer structure is shown. However, according to some example embodiments, the decoration layer DL may be provided in plural number and may be stacked on the light shielding area CA.

According to some example embodiments of the present disclosure, the window WD before assembly may be protected by a release film RF for a window. Hereinafter, the release film RF for the window will be referred to as a "release film RF". When the window WD is assembled with the display device, the release film RF may be detached from the window WD. That is, the window WD is assembled with the display device after the release film RF is detached from the window WD.

FIG. 2 shows a structure in which the release film RF is arranged on a rear surface among front and rear surfaces of the window WD, however, it should not be limited thereto or thereby. According to some example embodiments of the present disclosure, the release film RF may be arranged on both of the front and rear surfaces of the window WD.

The release film RF is arranged on the decoration layer DL of the window WD to cover the base substrate BS on the light transmitting area TA and the hole area HA and the decoration layer DL on the light shielding area CA.

The release film RF includes a hole adhesive film CPL and a window adhesive film WPL.

The hole adhesive film CPL overlaps with the hole area HA when viewed in a plan view. The hole adhesive film CPL protects the hole area HA to prevent dust from entering the window WD from the camera or lens of the photosensor that is arranged to overlap with the hole area HA when the display device is assembled. According to some example embodiments of the present disclosure, an area of the hole adhesive film CPL may be larger than an area of the hole area HA. Accordingly, the hole adhesive film CPL may be arranged on the decoration layer DL.

The window adhesive film WPL entirely overlaps with the base substrate BS when viewed in a plan view. That is, the window adhesive film WPL entirely overlaps with the light shielding area CA, the light transmitting area TA, and the hole area HA. The window adhesive film WPL covers the decoration layer DL, the hole adhesive film CPL, and the base substrate BS overlapping with the light transmitting area TA. The window adhesive film WPL may be attached to an upper surface of the decoration layer DL, an upper surface of the hole adhesive film CPL, and an upper surface of the base substrate BS overlapping with the light transmitting area TA. For example, the window adhesive film WPL may have an adhesive strength equal to or larger than about 50 $gf/in^2$ and equal to or smaller than about 1000 $gf/in^2$.

The window adhesive film WPL according to some example embodiments of the present disclosure may include a material having a relatively high internal bonding energy between molecules. For example, the window adhesive film WPL may include polyvinyl chloride (PVC) and phthalate (excluding six prohibited substances). In detail, a weight percent of polyvinyl chloride relative to a total weight of the window adhesive film WPL is equal to or more than about 55 wt % and equal to or less than about 65 wt %, and a weight percent of phthalate relative to the total weight of the window adhesive film WPL is equal to or more than about 35 wt % and equal to or less than about 65 wt %. According to some example embodiments of the present disclosure, the phthalate may not include BBP, DBP, DnOP, DEHP, DINP, and DIDP.

In addition, the window adhesive film WPL according to some example embodiments of the present disclosure may further include at least one of a pigment, a diluent, and an additive.

Figure 3:
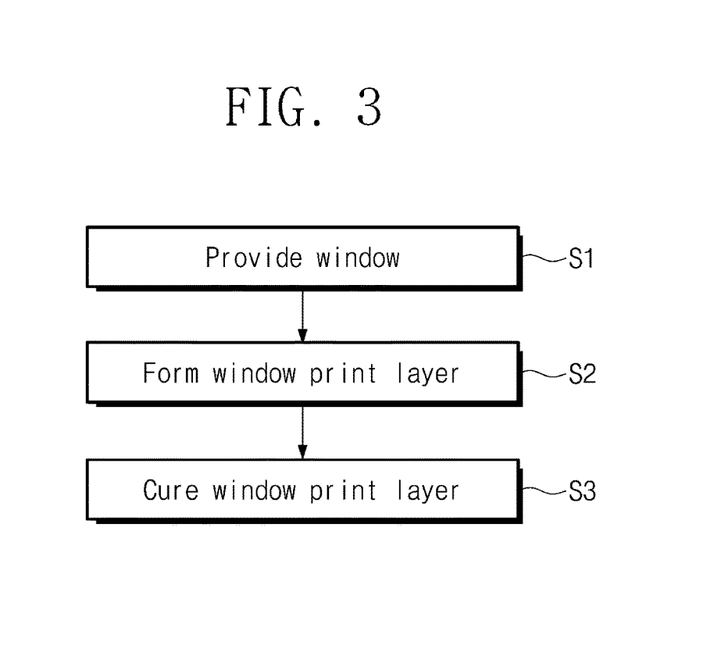
FIG. 3 is a flowchart showing a method of manufacturing a release film for a window according to some example embodiments of the present disclosure.

FIG. 3 is a flowchart showing a method of manufacturing the release film for the window according to some example embodiments of the present disclosure, and FIGS. 4 to 7 are cross-sectional views showing a method of manufacturing the release film for the window according to some example embodiments of the present disclosure.

Hereinafter, the method of manufacturing the release film according to some example embodiments of the present disclosure will be described in more detail with reference to FIGS. 4 to 7.

Figure 4:
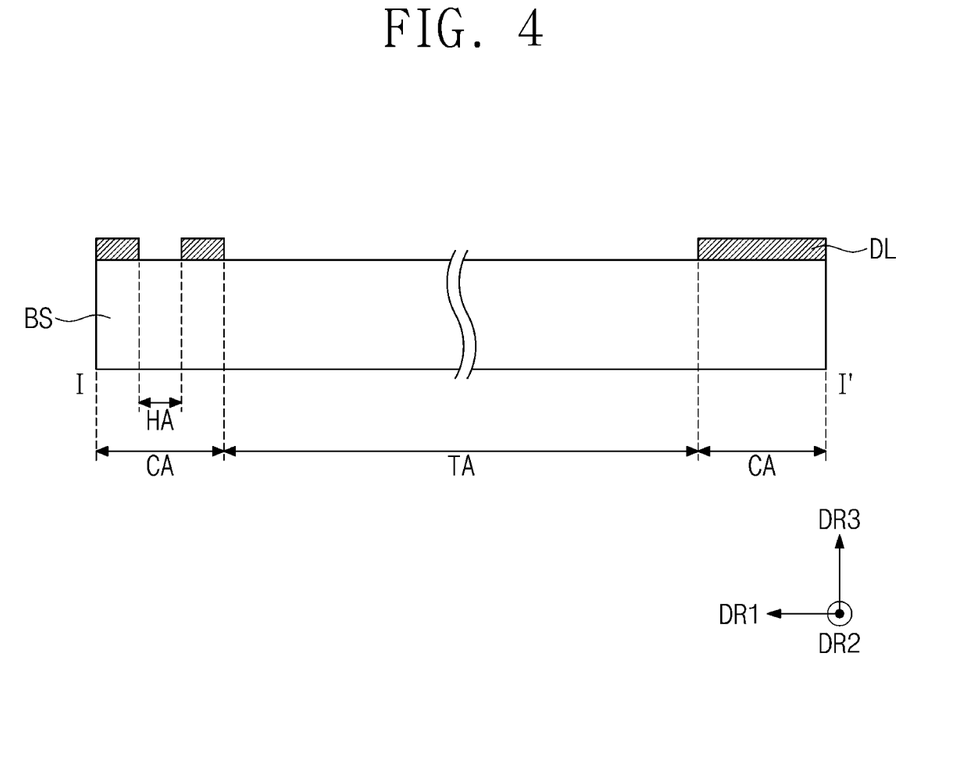
FIGS. 4 to 7 are cross-sectional views showing a method of manufacturing a release film for a window according to some example embodiments of the present disclosure.

As shown in FIG. 4, the window WD is provided (S1) (refer to FIG. 3). The providing of the window WD (S1) includes providing the base substrate BS and forming the decoration layer DL on the base substrate BS. The decoration layer DL includes an organic material or a metallic material. The method of forming the decoration layer DL of the present disclosure not particularly limited. For example, the decoration layer DL may be formed on the base substrate BS by a deposition process or an inkjet process.

Figure 5A:
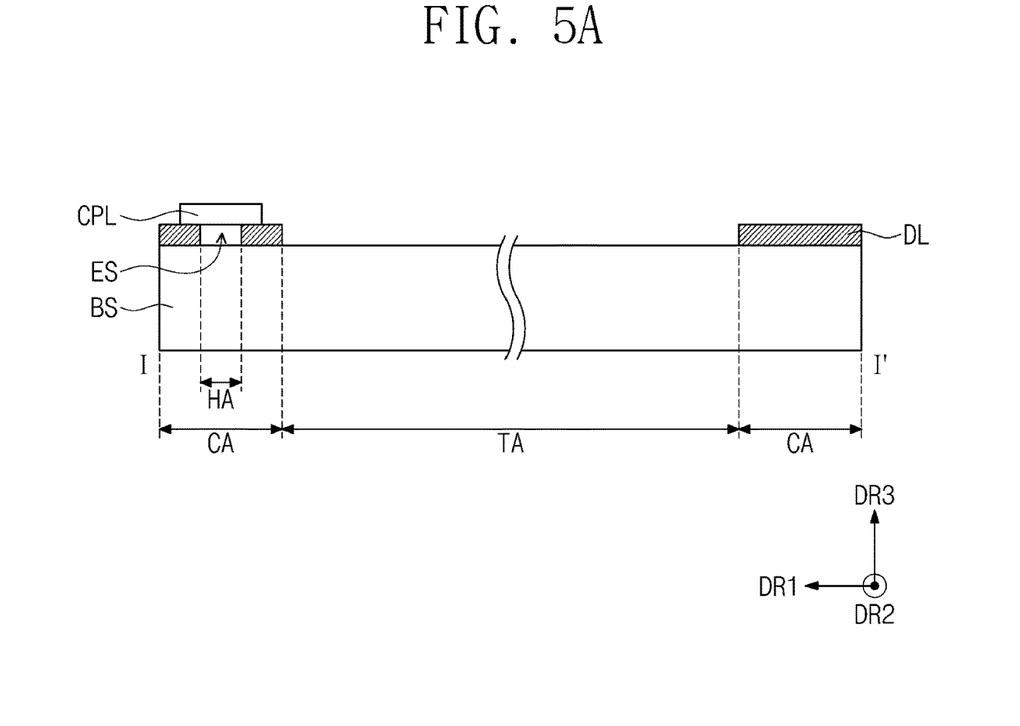

Then, as shown in FIG. 5A, the hole adhesive film CPL is attached onto the decoration layer DL adjacent to the hole area HA. The hole adhesive film CPL overlaps with the hole area HA. Although not shown in figures, the hole adhesive film CPL may include an adhesive layer arranged on a surface thereof facing the decoration layer DL.

Because the hole adhesive film CPL is arranged on the decoration layer DL, an enclosed space ES may be defined between the hole adhesive film CPL and the base substrate BS in the hole area HA.

In FIG. 5A, the hole adhesive film CPL is provided in a film shape and attached onto the decoration layer DL adjacent to the hole area HA, however, it should not be limited thereto or thereby. According to some example embodiments of the present disclosure, the hole adhesive film CPL is formed on the hole area HA in the form of ink and manufactured in the form of film through a curing process.

Figure 5B:
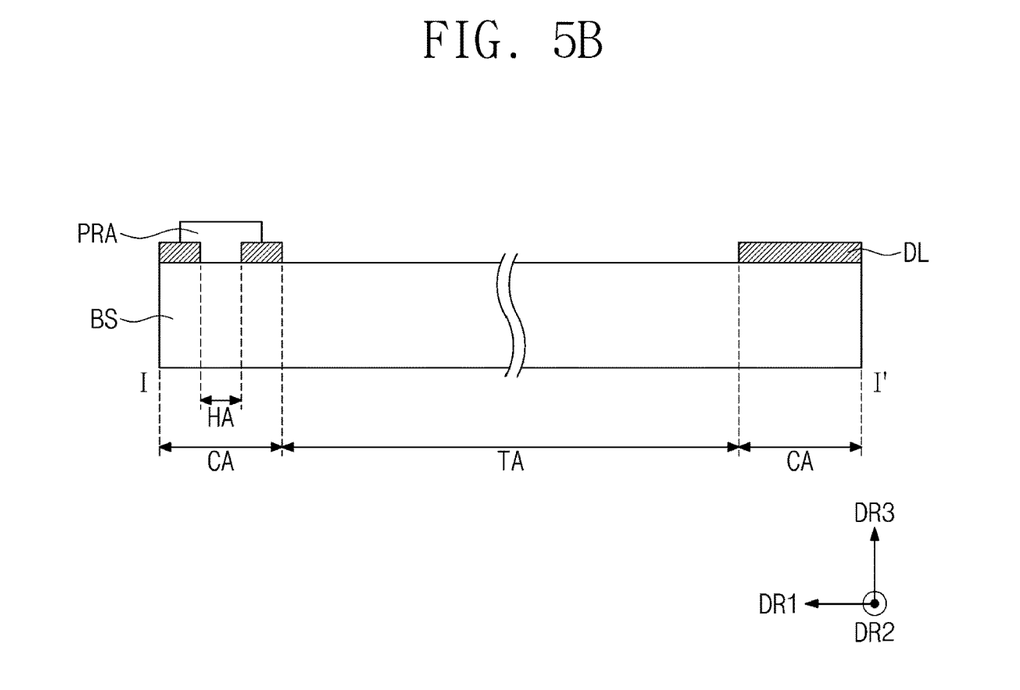

For example, as shown in FIG. 5B, according to some example embodiments of the present disclosure, a hole print layer PRA may be formed on the upper surface of the base substrate BS overlapping with the hole area HA and an upper surface of portions of the decoration layer DL adjacent to the hole area HA. The hole print layer PRA may be provided in the form of ink. As an example, the hole print layer PRA may be formed through a silk screen process. Further, the hole print layer PRA may be formed through various processes, such as an inkjet process, a spin coating process, a photolithography process, or a paddle process.

According to some example embodiments of the present disclosure, the hole print layer PRA may include a material having a relatively high internal bonding energy between molecules. For example, a weight percent of polyvinyl chloride relative to a total weight of the hole print layer PRA is equal to or more than about 55 wt % and equal to or less than about 65 wt %, and a weight percent of phthalate relative to the total weight of hole print layer PRA is equal to or more than about 35 wt % and equal to or less than about 65 wt %.

In addition, the hole print layer PRA according to some example embodiments of the present disclosure may further include at least one of a pigment, a diluent, and an additive.

Figure 5C:
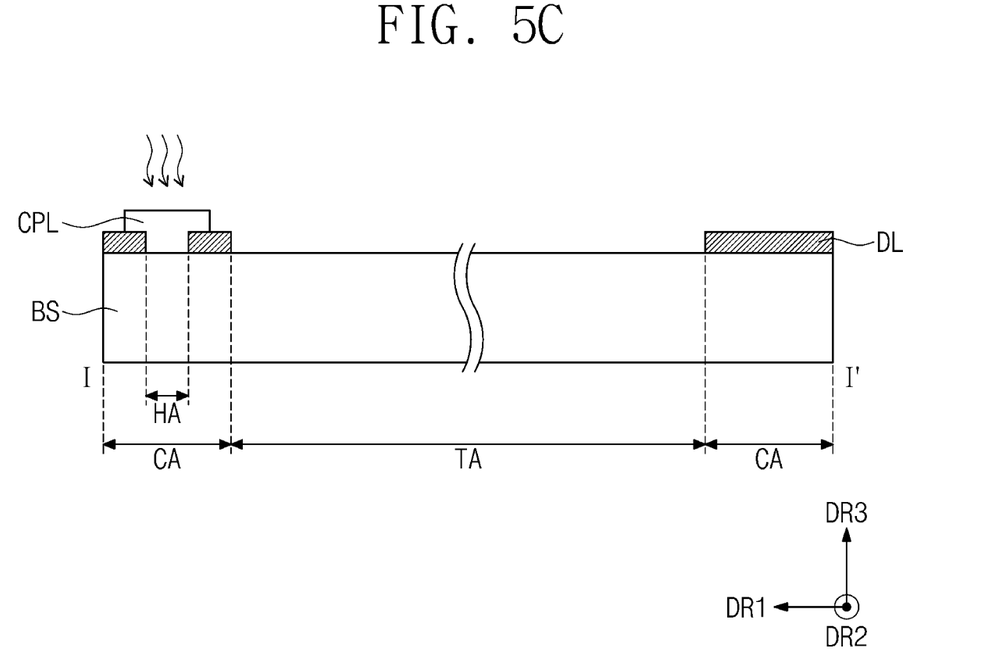

After the hole print layer PRA is formed, the hole print layer PRA is cured to form the hole adhesive film CPL as shown in FIG. 5C. The hole print layer PRA may be cured through a light-curing process, such as an ultraviolet (UV) curing process, or a heat-curing process, such as a baking process.

According to some example embodiments, as shown in FIGS. 5B and 5C, the above-mentioned enclosed space ES may be filled with the hole print layer PRA. Accordingly, an area where the hole adhesive film CPL makes contact with the decoration layer DL and the base substrate BS increases, and thus a fixing force of the hole adhesive film CPL to the window WD may increase.

Figure 6:
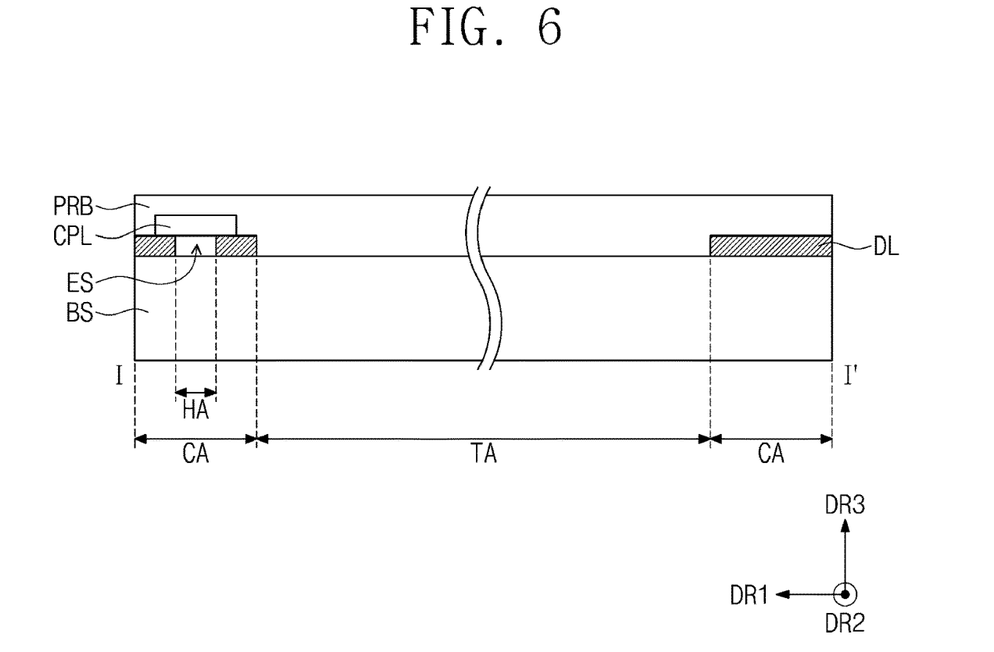

Referring to FIG. 6, after the attachment of the hole adhesive film CPL is completed, a window print layer PRB is formed to entirely overlap with the base substrate BS (S2, refer to FIG. 3). The window print layer PRB covers the decoration layer DL, the hole adhesive film CPL, and a portion of the base substrate BS, which overlaps with the light transmitting area TA.

The window print layer PRB may be provided in the form of ink. As an example, the window print layer PRB may be formed through a silk screen process. Further, the window print layer PRB may be formed through various processes, such as an inkjet process, a spin coating process, a photolithography process, or a paddle process.

According to some example embodiments of the present disclosure, the window print layer PRB may include a material having a relatively high internal bonding energy between molecules. For example, the window print layer PRB may include polyvinyl chloride (PVC) and phthalate. For example, a weight percent of polyvinyl chloride relative to a total weight of the window print layer PRB is equal to or more than about 55 wt % and equal to or less than about 65 wt %, and a weight percent of phthalate relative to the total weight of the window print layer PRB is equal to or more than about 35 wt % and equal to or less than about 65 wt %.

In addition, the window print layer PRB according to some example embodiments of the present disclosure may further include at least one of a pigment, a diluent, and an additive.

Figure 7:
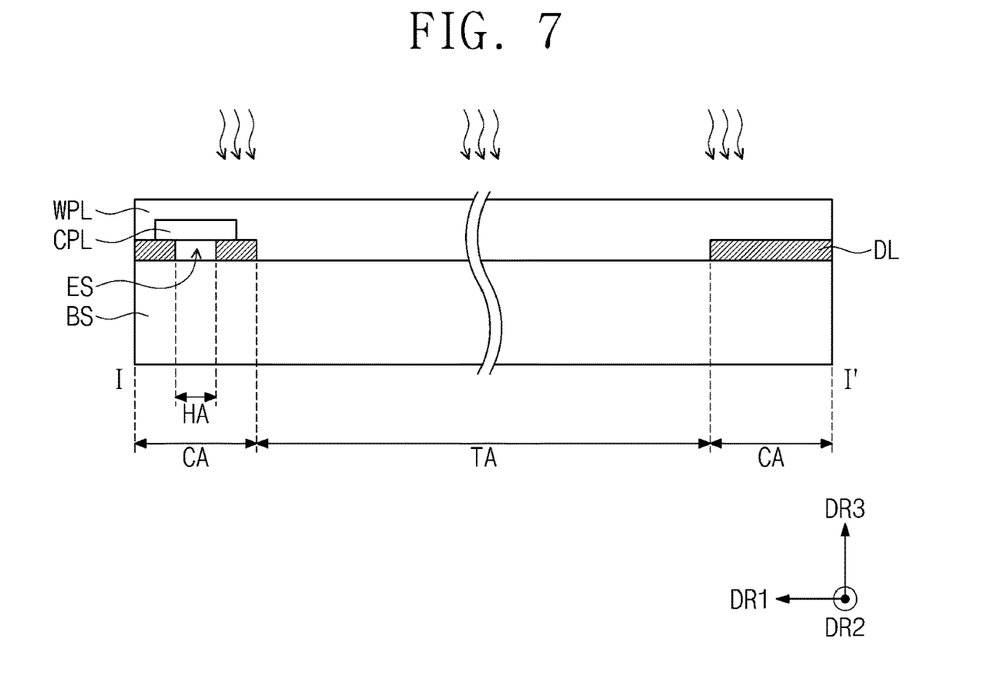

Then, as shown in FIG. 7, the window print layer PRB is cured to form the window adhesive film WPL (S3, refer to FIG. 3). The curing of the window print layer PRB (S3, refer to FIG. 3) may include irradiating an ultraviolet (UV) ray onto the window print layer PRB. In addition, according to some example embodiments of the present disclosure, the curing of the window print layer PRB (S3, refer to FIG. 3) may include applying heat onto the window print layer PRB.

In a case where the window adhesive film WPL is attached on the window WD in the form of film without being formed in the form of ink on the window WD, the adhesive strength of the film may be relatively low. In addition, a misalignment may occur between the release film RF (refer to FIG. 2) and the window WD due to the relatively low adhesive strength and a step difference between the decoration layer DL and the base substrate BS. In particular, the misalignment becomes worse in a case where a width of the light shielding area CA decreases. That is, a yield of the window WD may be reduced. However, according to some example embodiments of the present disclosure, because the print layers PRA and PRB are formed on the window WD in the form of ink, the step difference may be compensated. In addition, because the contact area between the print layers PRA and PRB and the window WD increases, the adhesive strength may be improved. That is, the yield of the window WD may increase.

Figure 8:
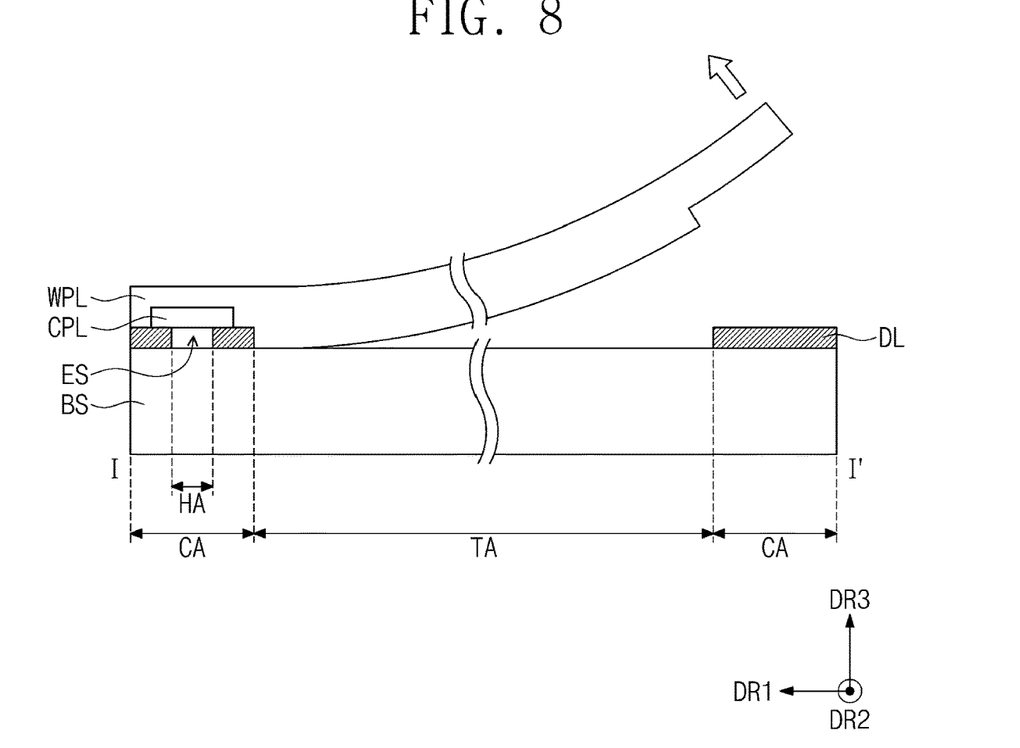
FIGS. 8 and 9 are cross-sectional views showing a process of separating a release film from a window according to some example embodiments of the present disclosure.
Figure 9:
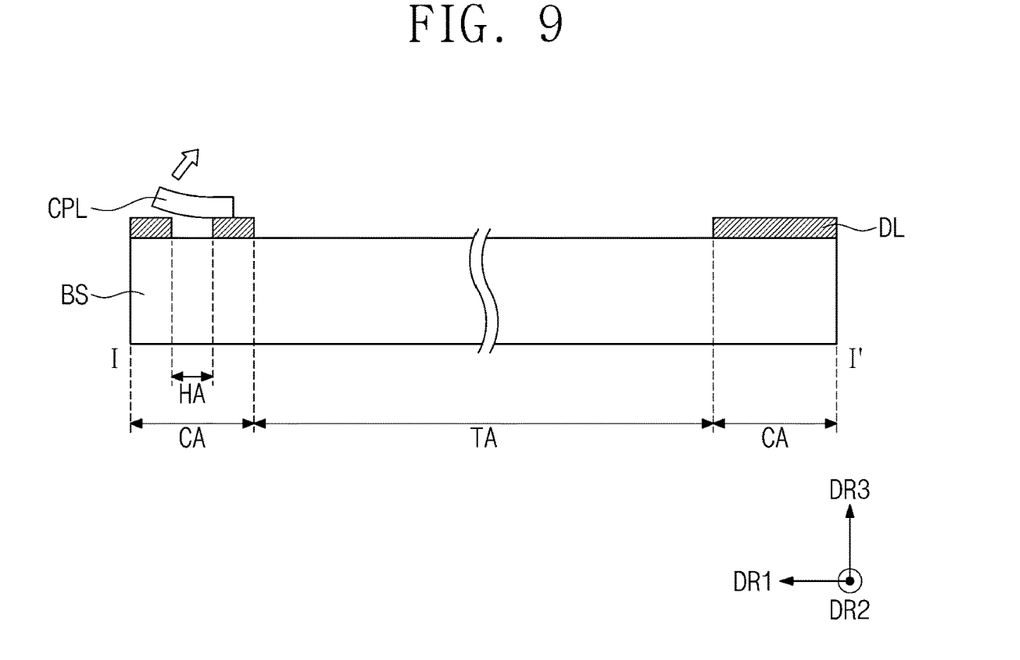

FIGS. 8 and 9 are cross-sectional views showing a process of separating the release film from the window according to some example embodiments of the present disclosure.

In the assembling of the display device, the window WD may be provided in a state in which the release film RF is detached. In addition, each of the window adhesive film WPL and the hole adhesive film CPL of the window WD may be independently detached.

For example, only the window adhesive film WPL may be first detached from the window WD. FIG. 8 shows a state in which only the window adhesive film WPL among the window adhesive film WPL and the hole adhesive film CPL is detached from the window WD. The window adhesive film WPL is separated from the hole adhesive film CPL. The hole adhesive film CPL is not detached from the window WD. FIG. 9 shows a state in which the hole adhesive film CPL is finally detached from the window WD. According to some example embodiments of the present disclosure, each of the window adhesive film WPL and the hole adhesive film CPL may be independently detached depending on the type of the assembly process.

Figure 10:
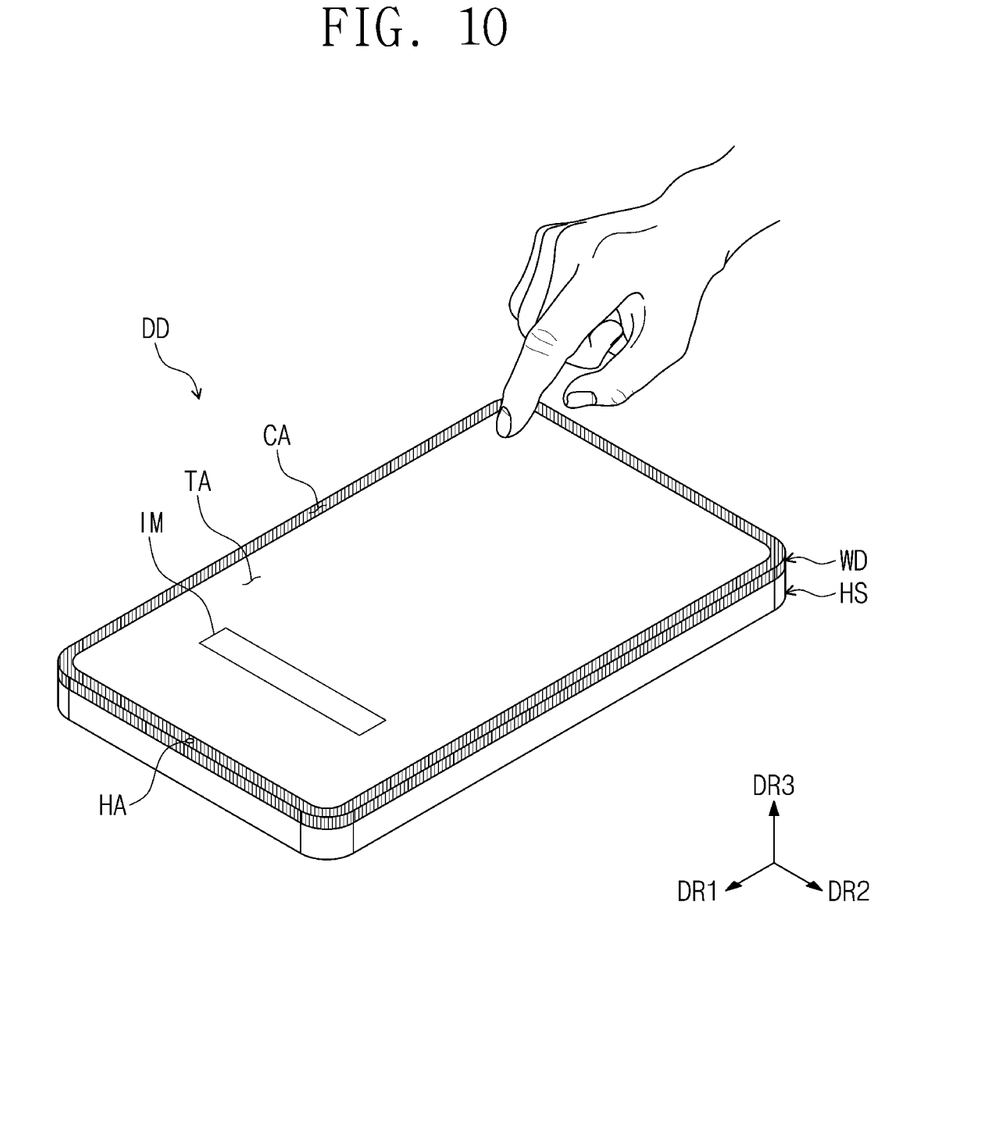
FIG. 10 is a perspective view showing a display device to which a window according to some example embodiments of the present disclosure is applied.

FIG. 10 is a perspective view showing a display device DD to which the window WD according to some example embodiments of the present disclosure is applied.

Referring to FIG. 10, the window WD from which the release film RF (refer to FIG. 2) is detached may be assembled with the display device DD.

For example, the display device DD includes the window WD, a display panel, an optical component, and a housing HS.

The window WD provides the front surface of the display device DD, and the housing HS provides the rear surface of the display device DD. The window WD is coupled to the housing HS to define an internal space of the display device DD. The display panel and various electronic components or optical components may be accommodated in the internal space. One of the optical components may overlap with the hole area HA described above. The optical components may transmit or receive signals from or to the outside through the hole area HA.

The display panel displays an image to a direction toward the window WD. The display panel according to the present disclosure should not be limited to a particular display panel. As an example, the display panel may be an organic electroluminescence display panel, a liquid crystal display panel, an electrowetting display panel, or a nano-crystal display panel. When the display panel is a light-receiving type display panel, the display device DD may further include a backlight unit located under the display panel to provide the light to the display panel.

The housing HS may include a plurality of frames and/or a plate, which includes a glass, plastic, or metallic material. The housing HS may stably protect the components of the display device DD, which are accommodated in the internal space, from external impacts.

Figure 11:
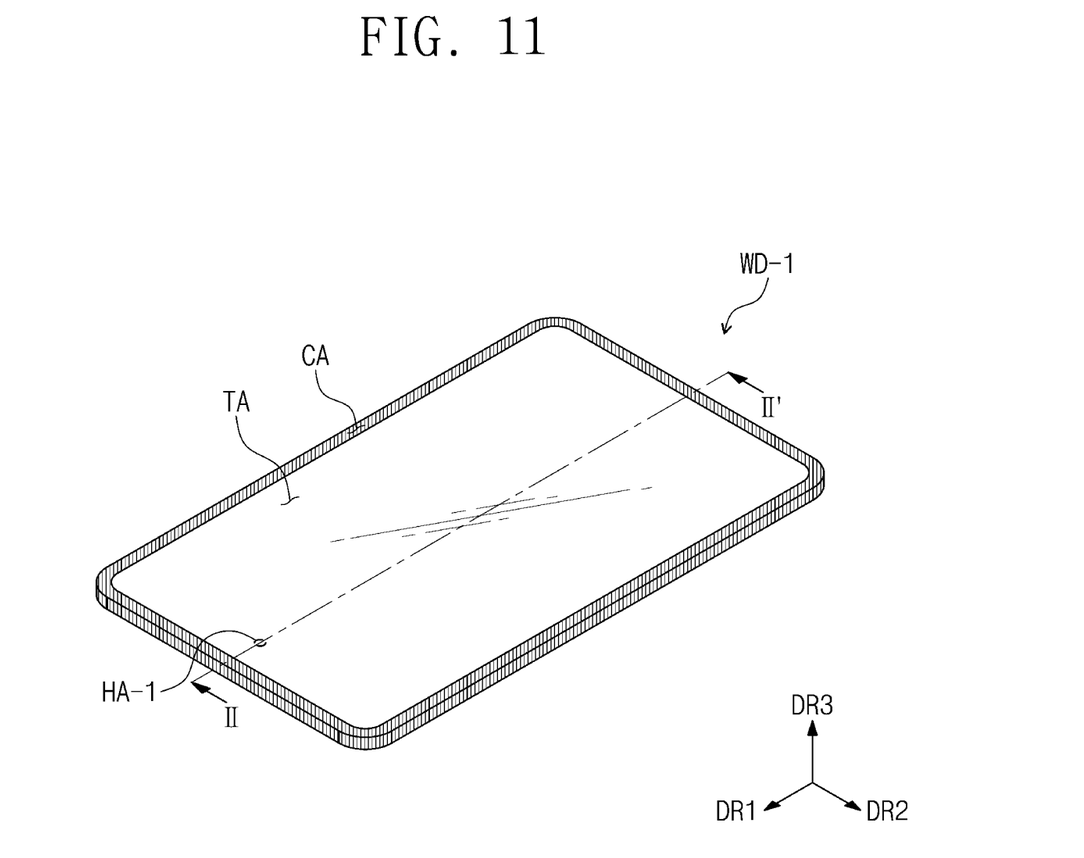
FIG. 11 is a perspective view showing a window according to some example embodiments of the present disclosure.
Figure 12:
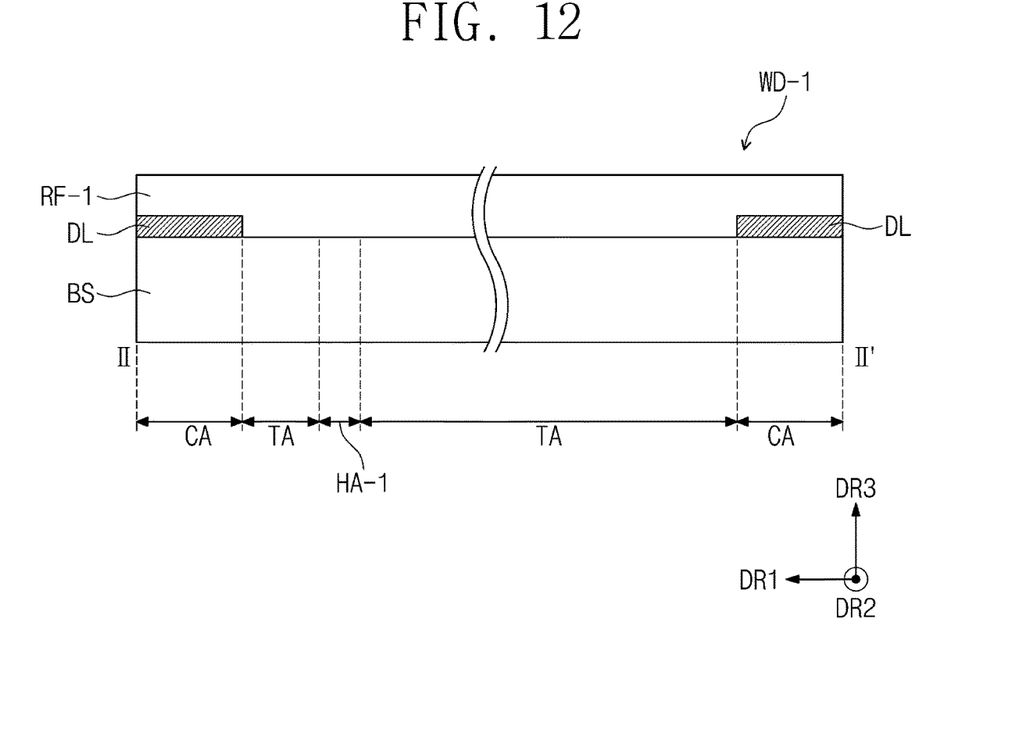
FIG. 12 is a cross-sectional view taken along a line II-II' shown in FIG. 11.

FIG. 11 is a perspective view showing a window WD-1 according to some example embodiments of the present disclosure, and FIG. 12 is a cross-sectional view taken along a line II-II' shown in FIG. 11.

For the convenience of explanation, different features from the previously described example embodiments of the present disclosure will be mainly described, and descriptions on components without a specific description are substantially the same as the previously described example embodiments of the present invention. In addition, the same components as those of the previously described example embodiment are assigned with the same reference numerals, and details thereof will be omitted.

Referring to FIG. 11, the window WD-1 according to some example embodiments of the present disclosure includes a light transmitting area TA, a light shielding area CA, and a hole area HA-1. Configurations of the light transmitting area TA and the light shielding area CA are substantially the same as those of the previously described embodiment, and thus details of the light transmitting area TA and the light shielding area CA will be omitted.

The hole area HA-1 is spaced apart from the light shielding area CA when viewed in a plan view. In addition, the hole area HA-1 may be surrounded by the light transmitting area TA.

The hole area HA-1 may overlap with a photosensor or camera included in a display device when viewed in a plan view. The photosensor or the camera may receive signals from the outside through the hole area HA-1. That is, a display device to which the window WD-1 according to some example embodiments is applied may receive the signal from the outside in the area surrounded by the light transmitting area TA through which the image transmits.

Referring to FIG. 12, the window WD-1 before assembly may be protected by a release film RF-1. When the window WD-1 is assembled with the display device, the release film RF-1 may be detached from the window WD-1. That is, the window WD-1 is assembled with the display device in a state in which the release film RF-1 is detached.

The release film RF-1 is arranged on a decoration layer DL of the window WD-1 in the light shielding area CA to cover the base substrate BS on the light transmitting area TA and the hole area HA-1 and the decoration layer DL on the light shielding area CA.

According to some example embodiments of the present disclosure, because the hole area HA-1 is spaced apart from the light shielding area CA in which the decoration layer DL is located, a separate hole adhesive film, for example, the hole adhesive film CPL (refer to FIG. 2), is not located. That is, the release film RF-1 may include only the window adhesive film WPL (refer to FIG. 2).

Figure 13:
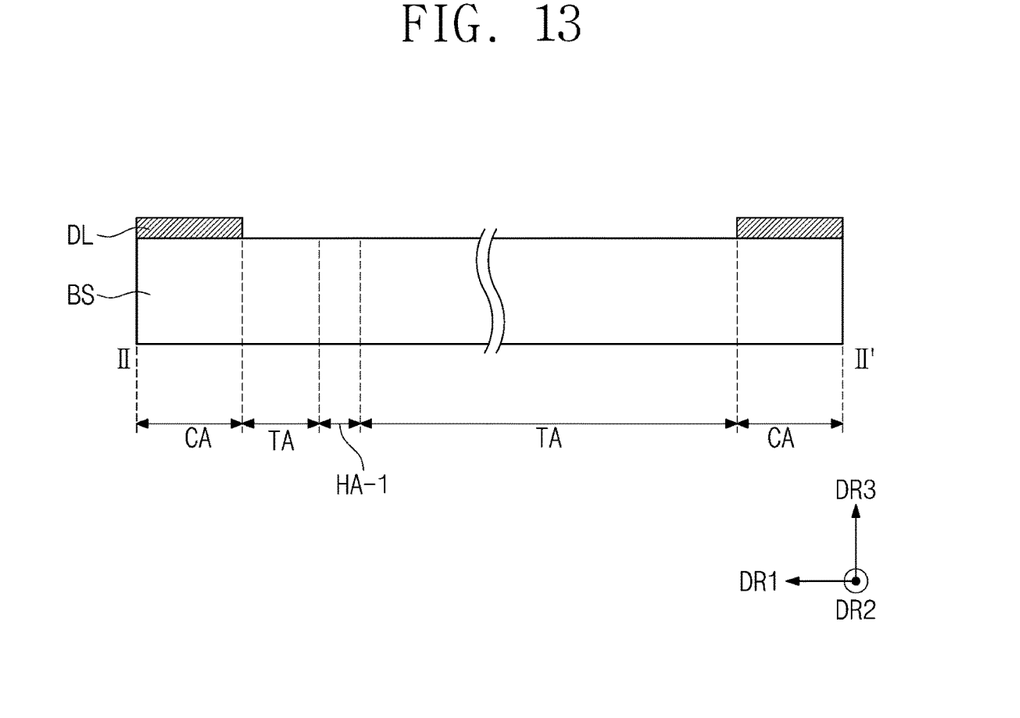
FIGS. 13 to 15 are cross-sectional views showing a method of manufacturing a release film for a window according to some example embodiments of the present disclosure.
Figure 14:
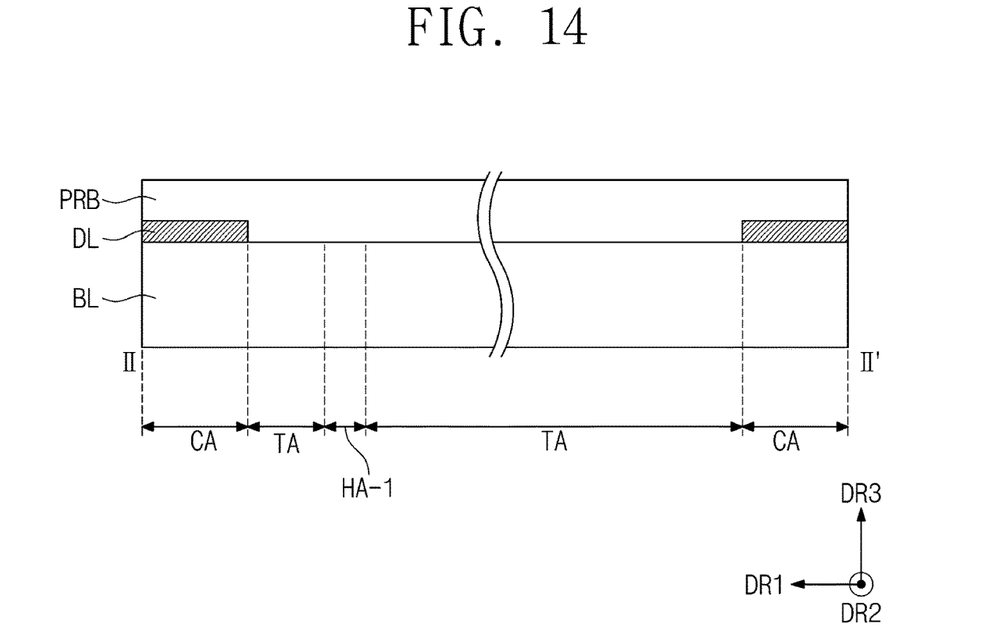
Figure 15:
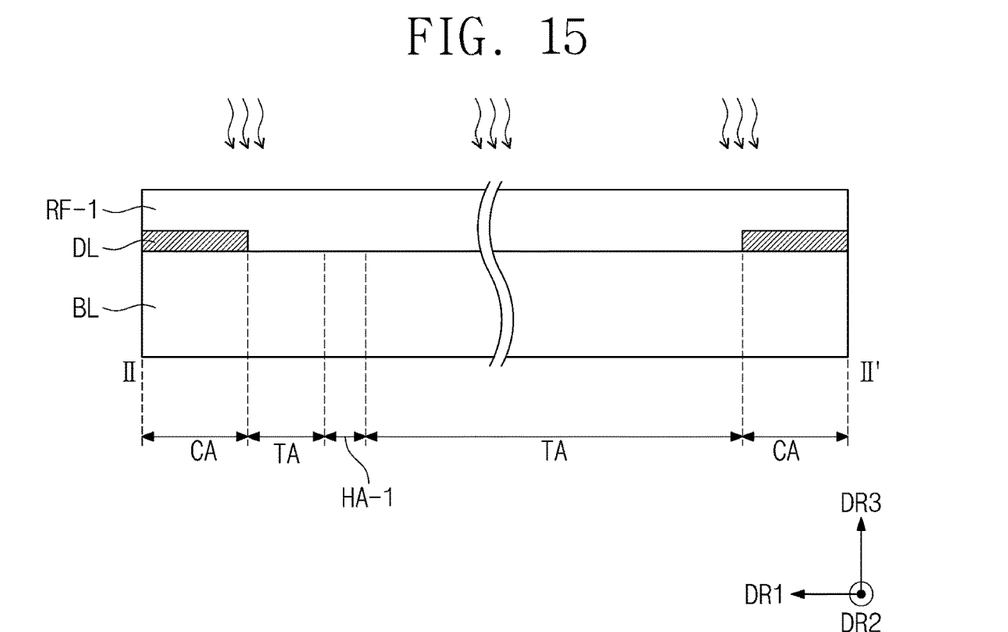

FIGS. 13 to 15 are cross-sectional views showing a method of manufacturing a release film for a window according to some example embodiments of the present disclosure. FIGS. 13 to 15 show the manufacturing method of the release film RF-1 shown in FIG. 12.

As shown in FIG. 13, the decoration layer DL is formed on the light shielding area CA of the window WD-1 in which the light transmitting area TA, the light shielding area CA, and the hole area HA-1 are defined. The decoration layer DL may include the organic material or the metallic material.

Then, as shown in FIG. 14, a window print layer PRB is formed to entirely overlap with the base substrate BS. The window print layer PRB covers a portion of the base substrate BS, which overlaps with the hole area HA-1 and the light transmitting area TA, and the decoration layer DL.

The window print layer PRB may be provided in the form of ink. For example, the window print layer PRB may be formed through a silk screen process. Further, the window print layer PRB may be formed through various processes, such as an inkjet process, a spin coating process, a photolithography process, or a paddle process.

As shown in FIG. 15, the window print layer PRB is cured to form the release film RF-1. The curing of the window print layer PRB may include applying an ultraviolet (UV) ray onto the window print layer PRB. In addition, according to some example embodiments of the present disclosure, the curing of the window print layer PRB may include applying heat onto the window print layer PRB.

Although aspects of some example embodiments of the present disclosure have been described, it is understood that the present disclosure should not be limited to these example embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims, and their equivalents.

What is claimed is:

1. A method of manufacturing a release film for a window, the method comprising:
   providing the window comprising a light transmitting area and a light shielding area;
   forming a window print layer on the window to entirely overlap the light transmitting area and the light shielding area; and
   curing the window print layer, wherein the window print layer comprises a polyvinyl chloride, wherein the window print layer further comprises at least one of a pigment, a diluent, or an additive.

2. The method of claim 1, wherein the providing of the window comprises:
providing a base substrate; and
forming a decoration layer on the light shielding area of the base substrate, wherein the window print layer covers the decoration layer in the forming of the window print layer.

3. The method of claim 1, wherein a weight percent of the polyvinyl chloride relative to a total weight of the window print layer is equal to or more than 55 wt % and equal to or less than 65 wt %.

4. The method of claim 1, wherein the window print layer further comprises a phthalate.

5. The method of claim 4, wherein a weight percent of the phthalate relative to a total weight of the window print layer is equal to or more than 35 wt % and equal to or less than 65 wt %.

6. The method of claim 2, wherein the window further comprises at least one hole area spaced apart from the light transmitting area and surrounded by the light shielding area, and the decoration layer is formed not to overlap with the hole area and the light transmitting area in the providing of the window.

7. The method of claim 6, further comprising, before the forming of the window print layer:
forming a hole print layer to overlap with the hole area; and
curing the hole print layer to form a hole adhesive film, wherein the window print layer covers the decoration layer and the hole adhesive film in the forming of the window print layer.

8. The method of claim 7, wherein the hole print layer comprises the polyvinyl chloride.

9. The method of claim 8, wherein a weight percent of the polyvinyl chloride relative to a total weight of the hole print layer is equal to or more than 55 wt % and equal to or less than 65 wt %.

10. The method of claim 7, further comprising attaching the hole adhesive film to overlap with the hole area before the forming of the window print layer, wherein the window print layer covers the decoration layer and the hole adhesive film in the forming of the window print layer.

11. The method of claim 1, wherein the window further comprises at least one hole area spaced apart from the light shielding area and surrounded by the light transmitting area, and the window print layer covers the hole area in the forming of the window print layer.

12. The method of claim 1, wherein the curing of the window print layer comprises applying a heat to the window print layer.

13. The method of claim 1, wherein the curing of the window print layer comprises irradiating an ultraviolet ray to the window print layer.

14. The method of claim 1, wherein the window print layer is formed through a silk screen process.

15. The method of claim 1, wherein the window print layer has an adhesive strength equal to or larger than 50 $gf/in^2$ and equal to or smaller than 1000 $gf/in^2$.

16. A release film for a window, comprising:
a window adhesive film on the window in which a light transmitting area transmitting an image and a light shielding area surrounding the light transmitting area and shielding the image are defined, wherein the window adhesive film comprises a polyvinyl chloride,
further comprising a hole adhesive film, wherein the window comprises at least one hole area defined therein, spaced apart from the light transmitting area, and surrounded by the light shielding area, the hole adhesive film overlaps with the hole area when viewed in a plan view, is between the window adhesive film and the window, and comprises the polyvinyl chloride, and the hole adhesive film is covered by the window adhesive film.

17. The release film of claim 16, wherein a weight percent of the polyvinyl chloride relative to a total weight of the window adhesive film is equal to or more than 55 wt % and equal to or less than 65 wt %.

18. The release film of claim 16, wherein the window adhesive film further comprises a phthalate.

19. The release film of claim 18, wherein a weight percent of the phthalate relative to a total weight of the window adhesive film is equal to or more than 35 wt % and equal to or less than 65 wt %.

20. The release film of claim 16, wherein the window comprises at least one hole area defined therein, spaced apart from the light shielding area, and surrounded by the light transmitting area, and the window adhesive film entirely covers the hole area, the light transmitting area, and the light shielding area.

* * * * *